United States Patent
Vaughan et al.

(10) Patent No.: US 9,680,382 B2
(45) Date of Patent: Jun. 13, 2017

(54) INPUT FREQUENCY MEASUREMENT

(71) Applicant: Power Integrations, Inc., San Jose, CA (US)

(72) Inventors: Peter Vaughan, Los Gatos, CA (US); Christian Pura Angeles, San Jose, CA (US)

(73) Assignee: Power Integrations, Inc., San Jose, CA (US)

( * ) Notice: Subject to any disclaimer, the term of this patent is extended or adjusted under 35 U.S.C. 154(b) by 121 days.

(21) Appl. No.: 14/816,961

(22) Filed: Aug. 3, 2015

(65) Prior Publication Data

US 2017/0040900 A1    Feb. 9, 2017

(51) Int. Cl.
| | |
|---|---|
| *H02M 3/335* | (2006.01) |
| *G01R 23/15* | (2006.01) |
| *H02M 1/08* | (2006.01) |
| *H02M 1/00* | (2006.01) |

(52) U.S. Cl.
CPC ...... *H02M 3/33507* (2013.01); *G01R 23/155* (2013.01); *H02M 1/08* (2013.01); *H02M 2001/0009* (2013.01)

(58) Field of Classification Search
CPC . H02M 2001/0003; H02M 2001/0025; H02M 2001/0029; H02M 2001/0048; H02M 1/42; H02M 3/335; H02M 3/33507; H02M 3/33515; H02M 3/33523; H02M 3/3353; H02M 3/33538; H02M 3/33546; H02M 3/33553; H02M 3/33576; H02M 3/337; H02M 7/04; H02M 7/12; H02M 7/155; H02M 7/1555; H02M 7/1557; H02M 7/217
See application file for complete search history.

(56) References Cited

U.S. PATENT DOCUMENTS

| | | | | |
|---|---|---|---|---|
| 8,553,439 B2* | 10/2013 | Gaknoki | ............... | H02M 1/083 363/21.12 |
| 9,560,718 B2* | 1/2017 | Sadwick | ............ | H05B 37/0218 |
| 2011/0115401 A1* | 5/2011 | Lo | ...................... | H05B 33/0812 315/287 |
| 2012/0280629 A1* | 11/2012 | Gaknoki | ............ | H05B 33/0815 315/186 |
| 2012/0286826 A1* | 11/2012 | King | .................. | H05B 33/0815 327/79 |
| 2013/0154495 A1* | 6/2013 | He | .......................... | H02M 1/44 315/210 |
| 2016/0134185 A1* | 5/2016 | Wang | ...................... | H02M 1/42 323/235 |

* cited by examiner

*Primary Examiner* — Emily P Pham
*Assistant Examiner* — Shahzeb K Ahmad
(74) *Attorney, Agent, or Firm* — Blakely Sokoloff Taylor & Zafman LLP

(57) ABSTRACT

A frequency determination circuit includes a positive crossing sense circuit coupled to receive an input voltage to sense a positive crossing of an input voltage. A validation circuit is coupled to the positive crossing sense circuit to validate a previous zero crossing and the positive crossing of the input voltage after the positive crossing of the of the input voltage has occurred. A measurement circuit is coupled to the positive crossing sense circuit and the validation circuit to count a time between positive crossing pulses of the input voltage. The measurement circuit is coupled to output a frequency signal that is representative of a frequency of the input voltage in response to the time between the positive crossing pulses of the input voltage.

30 Claims, 7 Drawing Sheets

INPUT FREQUENCY MEASUREMENT

BACKGROUND INFORMATION

Field of the Disclosure

The present invention relates generally to power converters, and more specifically to power converters utilized with dimmer circuits.

Background

Electronic devices use power to operate. Switched mode power converters are commonly used due to their high efficiency, small size and low weight to power many of today's electronics. Conventional wall sockets provide a high voltage alternating current. In a switching power converter, a high voltage alternating current (ac) input is converted to provide a well-regulated direct current (dc) output through an energy transfer element. The switched mode power converter control circuit usually provides output regulation by sensing one or more inputs representative of one or more output quantities and controlling the output in a closed loop. In operation, a switch is utilized to provide the desired output by varying the duty cycle (typically the ratio of the on time of the switch to the total switching period), varying the switching frequency, or varying the number of pulses per unit time of the switch in a switched mode power converter.

In one type of dimming for lighting applications, a TRIAC dimmer circuit typically alters the ac input voltage by disconnecting the ac input voltage for a fraction of each period to limit the amount of voltage and current supplied to an incandescent lamp. This is known as phase dimming because it is often convenient to designate the position of the TRIAC dimmer circuit and the resultant amount of missing voltage in terms of the fraction of the period of the ac input voltage measured in degrees. In general, the ac input voltage is a sinusoidal waveform and the period of the ac input voltage is referred to as a full line cycle. As such, half the period of the ac input voltage is referred to as a half line cycle. An entire period has 360 degrees, and a half line cycle has 180 degrees. Typically, the phase angle is a measure of how many degrees (from a reference of zero degrees) of each half line cycle the TRIAC dimmer circuit disconnects the ac input. As such, removal of half the ac input voltage in a half line cycle by the TRIAC dimmer circuit corresponds to a phase angle of 90 degrees. In another example, removal of a quarter of the ac input voltage in a half line cycle corresponds to a phase angle of 45 degrees. On the other hand, the conduction angle is a measure of how many degrees (from a reference of zero degrees) of each half line cycle that are not disconnected by the TRIAC dimmer circuit. In other words, the conduction angle is a measure of how many degrees of each half line cycle in which the TRIAC dimmer circuit is conducting. In one example, the removal of a quarter of the ac input voltage in a half line cycle corresponds to a phase-angle of 45 degrees and a conduction angle of 135 degrees.

Although phase-angle dimming works well with incandescent lamps that receive the altered ac input voltage directly, it typically creates problems for light emitting diode (LED) lamps that are often driven by regulated power converters. The regulated power converters are used to provide the LED lamps with a regulated current and voltage from the altered ac power line. However, conventional power converters often produce non-ideal results when used with TRIAC dimmer circuits. As a result, flickering or shimmering of the LED lamp can occur at large conduction angles and flashing of the LED lamp can occur at low conduction angles.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
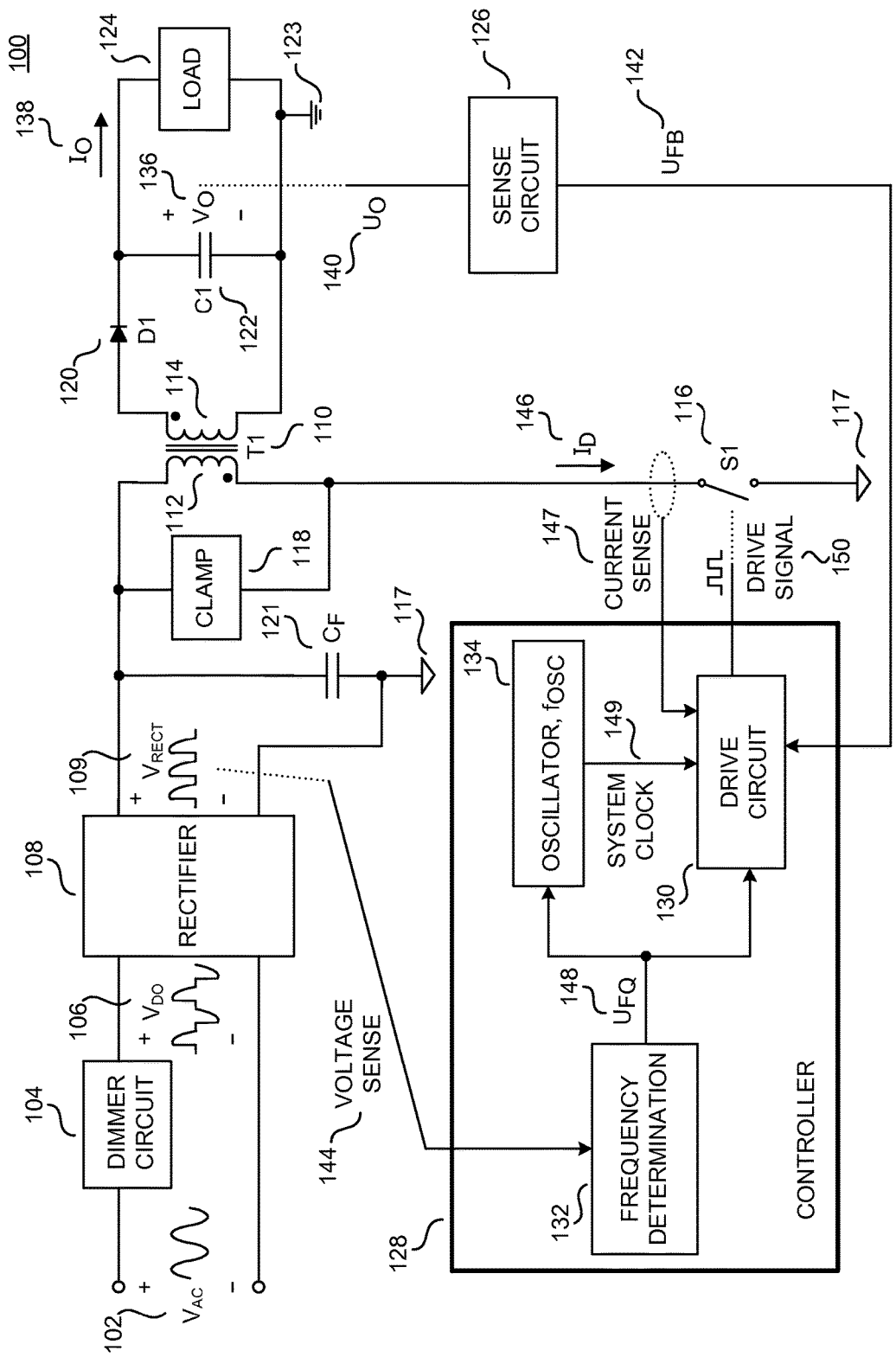
FIG. 1 is a schematic illustrating an example power converter with a dimmer circuit utilizing a controller in accordance with an example of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

For phase dimming applications, including those for light emitting diodes (LEDs), a phase dimmer circuit typically disconnects a portion of the ac input voltage at every half line cycle to limit the amount of voltage and current supplied to the LEDs. Typically the phase angle is a measure of how many degrees of each half line cycle the dimmer circuit has disconnected the input. Alternatively, the amount of the ac input voltage that the dimmer circuit does not disconnect may be referred to as the conduction angle.

Power converters may include an oscillator, which outputs a system clock characterized by a clock frequency $f_{OSC}$ and clock period $T_{OSC}$. The conduction angle may be measured by determining the number of cycles of the system clock that the dimmer circuit has connected or disconnected the ac input voltage. The clock frequency $f_{OSC}$ (and ergo the clock period $T_{OSC}$) of the system clock may be synchronized to the half line frequency $f_{HL}$ of the ac input voltage. When the clock frequency $f_{OSC}$ is synchronized to the half line frequency $f_{HL}$ of the ac input voltage, measurements for the conduction angle and/or phase angle may be substantially independent of the full and half line frequency of the ac input voltage.

The half line frequency $f_{HL}$ and full line frequency $f_{FL}$ of the ac input voltage may be measured by threshold detection where the input voltage may be compared to a reference threshold. The half line cycle $T_{HL}$ may be the amount of time between consecutive positive crossings of the input voltage, where positive crossings are denoted as the time when the input voltage crosses and is greater than the reference threshold. The full line cycle $T_{HL}$ may be the amount of time between every other positive crossing.

However, certain dimmer circuits require a minimum amount of holding current to keep the dimmer circuit conducting, such as a TRIAC dimmer circuit. The sharply increasing input voltage when the dimmer circuit fires during each half line cycle can cause inrush input current ringing, which may reverse several times during the half line cycle. During these current reversals, the dimmer circuit may prematurely turn off and cause flickering in the LED lamp. In addition, the input voltage may fall below the reference threshold and the half line frequency $f_{HL}$ and full line frequency $f_{FL}$ may be incorrectly measured using threshold detection.

Examples of the in accordance with the teachings of the present invention include a frequency determination circuit that senses and validates positive crossings of the input voltage. Further, the frequency determination circuit measures the half line frequency in response to the sensed and validated positive crossings. The frequency determination circuit may include a positive crossing sense circuit, a validation circuit, and a measurement circuit. The frequency determination circuit may further include a zero crossing sense circuit and a blanking circuit.

The positive crossing sense circuit outputs a pulse when a positive crossing is sensed. The positive crossing may be determined when the input voltage is greater than a first threshold after a first amount of time (blanking time, X cycles) has passed and a zero crossing has been sensed. A zero crossing may be sensed when the input voltage is less than a second threshold for a minimum length substantially equal to a second amount of time (Y clock cycles). The zero crossing sense circuit may output a signal indicating whether a zero crossing has been sensed to the positive crossing sense circuit. Further, the blanking circuit may output a signal indicating whether the first amount of time (blanking time) is over.

The validation circuit determines whether the sensed positive crossings are valid or invalid and outputs a pulse when the previous sensed positive crossing is invalid. The validation circuit may determine that the previous positive crossing is invalid (and the previous sensed zero crossing is invalid) if another zero crossing is sensed before a third amount of time (Z cycles) has passed. The validation circuit outputs a pulse when it is determined that the previous zero crossing and positive crossing is invalid.

The measurement block measures the line frequency in response to the positive crossing sense circuit and the validation circuit. The measurement block may measure the time between positive crossings and outputs this time as the half line frequency. The time between positive crossings may be measured using a counter. When the counter receives a pulse from the positive crossing circuit, the counter outputs and saves its internal count to a register and resets. That saved internal count is output as the half line frequency. However, if a pulse is received from the validation circuit indicating that the previous pulse from the positive crossing circuit is invalid, the counter previously saved internal count is added back to the counter. The validation circuit then enables (through the blanking circuit) the positive crossing sense circuit to sense a positive crossing without waiting for the first amount of time (X cycles) to pass. As such, the previous positive crossing is invalidated and the measurement circuit may continue measuring the time between positive crossings.

To illustrate, FIG. 1 is a block diagram of an example power converter 100 including an ac input voltage $V_{AC}$ 102, a dimmer circuit 104, a dimmer output voltage $V_{DO}$ 106, a rectifier 108, a rectified voltage $V_{RECT}$ 109, an energy transfer element T1 110, a primary winding 112 of the energy transfer element T1 110, a secondary winding 114 of the energy transfer element T1 110, a switch S1 116, input return 117, a clamp circuit 118, a rectifier D1 120, an input capacitor $C_F$ 121, an output capacitor C1 122, a load 124, a sense circuit 126, and a controller 128. Controller 128 further includes a drive circuit block 130, an oscillator 134, and a line frequency measurement circuit 132. In one example, sense circuit 126 may also be included in controller 128. FIG. 1 further illustrates an output voltage $V_O$ 136, an output current $I_O$ 138, an output quantity $U_O$ 140, a feedback signal $U_{FB}$ 142, a voltage sense signal 144, a switch current $I_D$ 146, a current sense signal 147, a system clock 149, a line frequency signal $U_{FO}$ 148 and a drive signal 150. The example switched mode power converter 100 illustrated in FIG. 1 is coupled in a flyback configuration, which is just one example of a switched mode power converter that may benefit from the teachings of the present invention. It is appreciated that other known topologies and configurations of switched mode power converters may also benefit from the teachings of the present invention. In addition, the example power converter in FIG. 1 is an isolated power converter. It should be appreciated that non-isolated power converters may also benefit from the teachings of the present invention.

The power converter 100 provides output power to the load 124 from an unregulated input voltage, such as the ac input voltage $V_{AC}$ 102 or the rectified voltage $V_{RECT}$ 109. As shown, dimmer circuit 104 receives the ac input voltage $V_{AC}$ 102 and produces the dimmer output voltage $V_{DO}$ 106. The dimmer circuit 104 may be utilized to limit the voltage delivered to the power converter 100 and may be a TRIAC phase dimmer. The dimmer circuit 104 further couples to the rectifier 108 and the dimmer output voltage $V_{DO}$ 106 is received by the rectifier 108.

For the example of an LED load, or a load of LED arrays, when the dimmer circuit 104 limits the amount of power delivered to the power converter, the resultant current delivered to the load of LED arrays by the controller 128 is also limited and the LED array dims. As mentioned above, the dimmer circuit 104 may be a phase dimming circuit such as a TRIAC dimmer circuit or a Metal-Oxide-Semiconductor Field Effect Transistor (MOSFET) dimmer circuit. For leading edge dimming, the dimmer circuit 104 disconnects the ac input voltage $V_{AC}$ 102 when the ac input voltage $V_{AC}$ 102 crosses zero voltage. After a given amount of time, the dimmer circuit 104 reconnects the ac input voltage $V_{AC}$ 102 with the power converter 100. The amount of time before the dimmer circuit reconnects the ac input voltage $V_{AC}$ 102 is set by a user. For trailing edge dimming, the dimmer circuit 104 connects the input to the power converter when the ac input voltage $V_{AC}$ 102 crosses zero voltage. After a given amount of time set by a user, the dimmer circuit 104 then disconnects the ac input voltage $V_{AC}$ 102 for the remainder of the half cycle. Depending on the desired amount of dimming, the dimmer circuit 104 controls the amount of time the ac input voltage $V_{AC}$ 102 is disconnected from the power converter 100. In general, the more dimming wanted corresponds to a longer period of time during which the dimming circuit 104 disconnects the ac input voltage $V_{AC}$ 102.

The rectifier 108 receives and rectifies the dimmer output voltage $V_{DO}$ 106 and outputs the rectified voltage $V_{RECT}$ 109. The rectifier 108 is further coupled to the energy transfer element T1 110. In some embodiments, the energy transfer element T1 110 may be a coupled inductor, a transformer, or an inductor. The energy transfer element T1 110 shown includes two windings, a primary winding 112 and a secondary winding 114. However, it should be appreciated that the energy transfer element T1 110 may have more than two windings. The power converter 100 utilizes the energy transfer element T1 110 to transfer energy between the primary winding 112 and the secondary winding 114. The primary winding 112 is further coupled to switch S1 116, which is then further coupled to input return 117.

In addition, the clamp circuit 118 is illustrated in the example of FIG. 1 as being coupled across the primary winding 112 of the energy transfer element T1 110. The filter capacitor $C_F$ 121 may be coupled to the primary winding 112 as shown, and filters high frequency current from the switch S1 116. For some applications, the size of the filter capacitor $C_F$ 121 may be large enough such that a substantially constant dc voltage is applied to the energy transfer element T1 110. However for other applications, the size of the filter capacitor $C_F$ 121 may be small enough such that the voltage applied to the energy transfer element T1 110 substantially follows the rectified voltage $V_{RECT}$ 109. Secondary winding 114 of the energy transfer element T1 110 is coupled to the rectifier D1 120, which is exemplified as a diode in the depicted example. However, the rectifier D1 120 may be a transistor used as a synchronous rectifier. Both the output capacitor C1 122 and the load 124 are shown as being coupled to the rectifier D1 120 and the output return 123. An output is provided to the load 124 and may be provided as either a regulated output voltage $V_O$ 136, regulated output current $I_O$ 138, or a combination of the two. In one embodiment, the load 124 may be a light emitting diode (LED), an LED module or an LED array.

The power converter 100 further includes circuitry to regulate the output, which is exemplified as output quantity $U_O$ 136. In general, the output quantity $U_O$ 136 is either an output voltage $V_O$ 136, an output current $I_O$ 138, or a combination of the two. A sense circuit 126 is coupled to sense the output quantity $U_O$ 140 and to provide feedback signal $U_{FB}$ 142, which is representative of the output quantity $U_O$ 140.

Controller 128 is coupled to the sense circuit 126 and receives the feedback signal $U_{FB}$ 142 from the sense circuit 126. The controller 128 further includes terminals for receiving the voltage sense signal 144, current sense signal 147 and for providing the drive signal 150 to power switch S1 116. In the example of FIG. 1, the voltage sense signal 144 may be representative of the rectified voltage $V_{RECT}$ 109. However, in other examples the voltage sense signal 144 may be representative of the dimmer output voltage $V_{DO}$ 106. The voltage sense signal 144 may be a voltage signal or a current signal. The current sense signal 147 may be representative of the switch current $I_D$ 146 in the power switch S1 116. Current sense signal 147 may also be a voltage signal or a current signal. In addition, the controller 128 provides drive signal 150 to the power switch S1 116 to control various switching parameters of the power switch S1 116 which controls the transfer of energy from the input of power converter 100 to the output of power converter 100. Examples of such parameters may include switching frequency, switching period, duty cycle, or respective ON and OFF times of the power switch S1 116.

Switch S1 116 is opened and closed in response to the drive signal 150. In operation, the switching of the switch S1 116 produces a pulsating current at the rectifier D1 120. The current is filtered by the output capacitor C1 122 to produce a substantially constant output voltage $V_O$ 136, output current $I_O$ 138, or a combination of the two. In one example, the switch S1 116 may be a transistor such as a metal-oxide-semiconductor field-effect transistor (MOSFET). In another example, controller 128 may be implemented as a monolithic integrated circuit or may be implemented with discrete electrical components or a combination of discrete and integrated components. Controller 128 and switch S1 116 could form part of an integrated circuit that is manufactured as either a hybrid or monolithic integrated circuit.

As illustrated in FIG. 1, controller 128 further includes frequency determination circuit 132, oscillator 134, and drive circuit 130. Drive circuit 130 is coupled to control switching of switch 116 (via drive signal 150) in response to feedback reference signal $U_{REF}$ 142. In addition, the drive circuit 130 may also be coupled to be responsive to the current sense signal 147, system clock 149, and the frequency signal $U_{FQ}$ 148. Although a single controller is illustrated in FIG. 1, it should be appreciated that multiple controllers may be utilized by the power converter 100. In addition, the drive circuit 130, frequency determination circuit 132, and oscillator 134 need not be within a single controller.

Frequency determination circuit 132 is coupled to receive the voltage sense signal 144 and generate the frequency signal $U_{FQ}$ 148, which is representative of the frequency of the voltage sense signal 144. As mentioned above, the voltage sense signal 144 may be representative of the frequency of the rectified voltage $V_{RECT}$ 109 or the dimmer output voltage $V_O$ 106. The full and half line frequency of the ac input voltage $V_{AC}$ 102 may be derived from the rectified voltage $V_{RECT}$ 109 or the dimmer output voltage $V_O$ 106. In other words, the frequency signal $U_{FQ}$ 148 may be representative of the full or half line frequency of the ac input voltage $V_{AC}$ 102.

The oscillator 134 may be coupled to receive the frequency signal $U_{FQ}$ 148 and outputs a system clock with an oscillator frequency $f_{OSC}$, which is synchronized to the frequency signal $U_{FQ}$ 148. The oscillator frequency $f_{OSC}$ is much faster than the full and half line frequency of the ac input voltage $V_{AC}$ 102. The oscillator 134 may vary the oscillator frequency $f_{OSC}$ such that there are a fixed number of system clock cycles in one cycle of the frequency signal $U_{FQ}$ 148, which is representative of the frequency of the voltage sense signal 144.

Frequency determination circuit 132 may determine the frequency of the voltage sense signal 144 by sensing positive crossings and measuring the time between positive crossings. A positive crossing may be sensed when the input voltage (such as the rectified voltage $V_{RECT}$ 109) is greater than a first threshold after a first amount of time (such as a blanking time, X cycles) has passed since the previously sensed positive crossing and a zero crossing has been sensed. The zero crossing may be sensed when the input voltage (such as the rectified voltage $V_{RECT}$ 109) is less than a second threshold for a minimum length of time substantially equal to a second amount of time (Y clock cycles).

The frequency determination circuit 132 also validates positive crossings. When a positive crossing has been invalidated, this indicates that the previous measurement between positive crossings may have been incorrect. The previous positive crossing may be considered invalid (and the previously sensed zero crossing is invalid) if another zero crossing is sensed before a third amount of time (Z cycles) has passed since the previously sensed zero crossing.

The frequency determination circuit 132 determines the frequency by measuring the time between positive crossings. As will be further discussed, the time between positive crossings may be measured using a counter. When a positive pulse is sensed, the counter outputs and saves its internal count to a register and resets. That saved internal count is output as the frequency signal $U_{FQ}$ 148. However, if it determined that the previous positive crossing is invalid, the counter's previously saved internal count (i.e., frequency signal $U_{FQ}$ 148) is added back to the counter and the counter continues counting until the next positive crossing.

Figure 2:
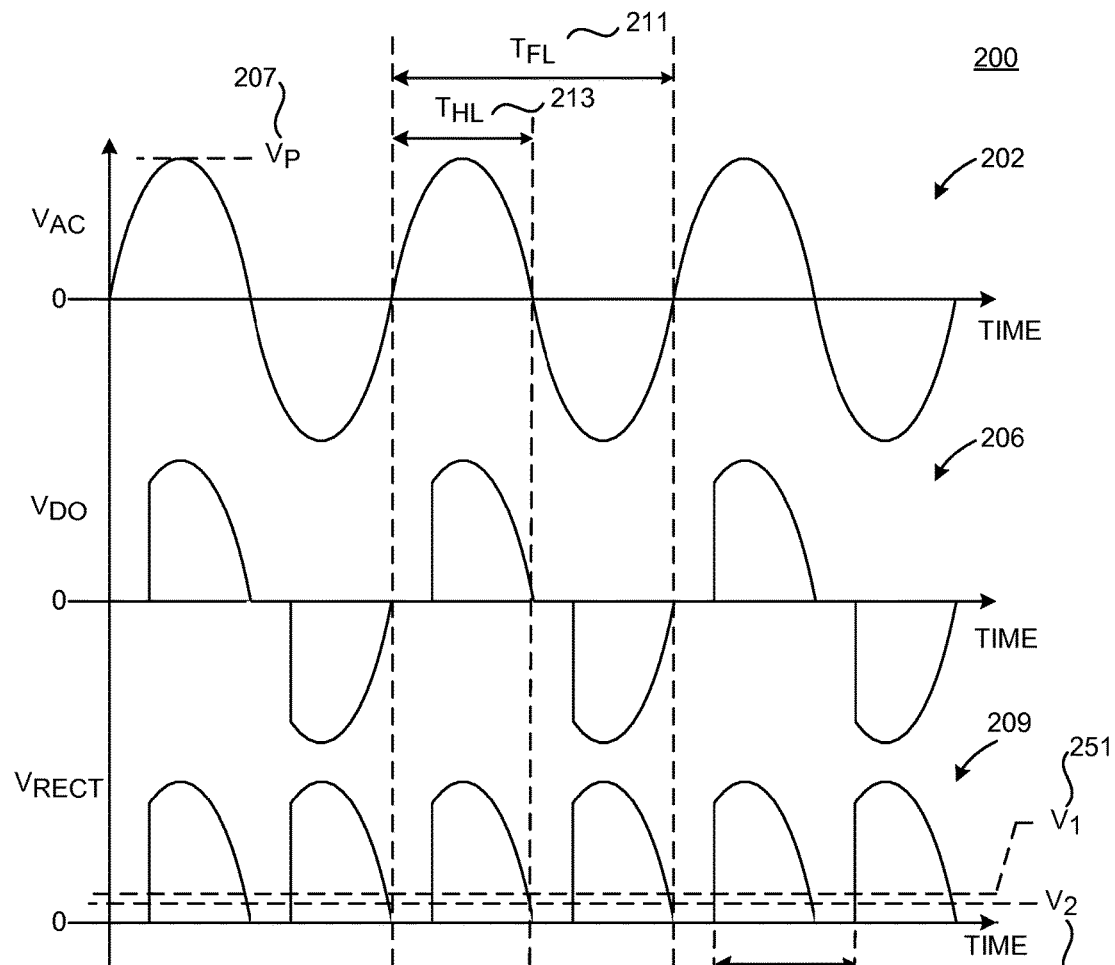
FIG. 2 is a diagram illustrating example waveforms of an ac input voltage, an output voltage of a dimmer circuit, and an output of a rectifier circuit of the power converter of FIG. 1 in accordance with an example of the present invention.

FIG. 2 illustrates example waveforms of an ac input voltage $V_{AC}$ 202, a dimmer output voltage $V_{DO}$ 206, and a rectified voltage $V_{RECT}$ 209. In particular, FIG. 2 illustrates the dimmer output voltage $V_{DO}$ 206 and a resultant rectified voltage $V_{RECT}$ 209 for leading edge TRIAC dimming.

In general, the ac input voltage $V_{AC}$ 202 is a sinusoidal waveform with the period of the ac input voltage $V_{AC}$ 202 referred to as a full line cycle $T_{FL}$ 211. Mathematically: $V_{AC}=V_P \sin(2\pi f_L t)$, where $V_P$ 207 is the peak voltage of the ac input voltage $V_{AC}$ and $f_L$ is the frequency of the ac input voltage $V_{AC}$ 202. It should be appreciated that the full line cycle $T_{FL}$ 211 is the reciprocal of the frequency $f_L$ (also referred to as the full line frequency), or mathematically:

$$T_{FL} = \frac{1}{f_L}.$$

As shown in FIG. 2, a full line cycle $T_{HL}$ 211 of the ac input voltage $V_{AC}$ 202 is denoted as the length of time between every other zero-crossing of the ac input voltage $V_{AC}$ 202. Further, the half line cycle $T_{HL}$ 213 is the reciprocal of double the frequency $f_L$ (also referred to as the half line frequency), or mathematically:

$$T_{HL} = \frac{1}{2f_L}.$$

As shown, the half line cycle $T_{HL}$ 213 of the ac input voltage $V_{AC}$ 202 is denoted as the length of time between consecutive zero-crossings.

For leading edge dimming, the dimmer circuit disconnects the ac input voltage $V_{AC}$ 202 from the power converter when the ac input voltage $V_{AC}$ 202 crosses zero voltage. After a given amount of time, the dimmer circuit reconnects the ac input voltage $V_{AC}$ 202 with the power converter and the dimmer output voltage $V_{DO}$ 206 substantially follows the ac input voltage $V_{AC}$ 202. In other words, the dimmer circuit disconnects the ac input voltage 202 for a portion of the half line cycle $T_{HL}$ 213 thus limiting the amount of power supplied to a load (such as an LED lamp). The rectifier circuit rectifies the dimmer output voltage $V_{DO}$ 206 thus providing the rectified voltage $V_{RECT}$ 209 as shown. For the example of FIG. 2, the rectified voltage $V_{RECT}$ 209 is substantially equal to zero voltage corresponding to when the dimmer circuit 104 disconnects the ac input voltage $V_{AC}$ 202 from the power converter. When the dimmer circuit reconnects the ac input voltage $V_{AC}$ 202 to the power converter, the rectified voltage $V_{RECT}$ 209 substantially follows the positive magnitude of the dimmer output voltage $V_{DO}$ 206 and the ac input voltage $V_{AC}$ 202. Or mathematically: $V_{RECT}=|V_{DO}|$.

Further illustrated in FIG. 2 are the first threshold $V_1$ 251 and second threshold $V_2$ 252, which may be used to sense positive crossings and zero crossings. As illustrated, positive crossings may correspond to when the rectified voltage $V_{RECT}$ 209 increases from zero. As will be discussed, positive crossing may be sensed by determining when the rectified voltage $V_{RECT}$ 109 is greater than a first threshold $V_1$ 251 after a first amount of time (such as a blanking time, X cycles) has passed since the previously sensed positive crossing and a zero crossing has been sensed. Zero crossings are generally when the rectified voltage $V_{RECT}$ 209 is substantially equal to zero and zero crossings may be sensed by determining the rectified voltage $V_{RECT}$ 109 is less than a second threshold $V_2$ 252 for a minimum length of time substantially equal to a second amount of time (Y clock cycles). It should be noted that the duration of time between positive crossings of the rectified voltage $V_{RECT}$ 209 is substantially equal to the half line cycle $T_{HL}$ 213. As such, sensed positive crossings may be utilized to determine the half line cycle $T_{HL}$ 213 and the half line frequency $$\frac{1}{2f_L}.$$

In one example, the first threshold $V_1$ 251 may be substantially 109 volts (V) while the second threshold $V_2$ 252 may be 80 V for high line design (230 VAC). The values may be rescaled (e.g., divided by 2) for low line design (120 VAC). The choice for these thresholds may be a balance between detecting the widest possible conduction time while working with dimmer circuits with significant off-state leakage current.

Figure 3:
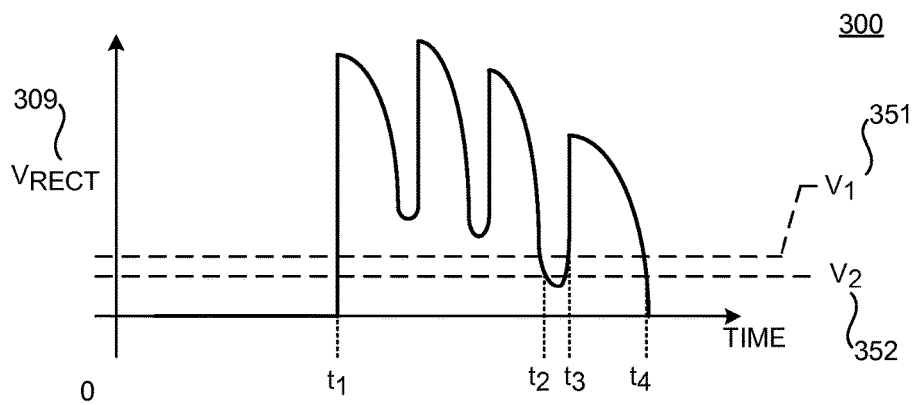
FIG. 3 is a diagram illustrating an example waveform of an output voltage of a dimmer circuit in case of dimmer circuit misfires in accordance with an example of the present invention.

FIG. 3 illustrates an example waveform of the rectified voltage $V_{RECT}$ 309 when the dimmer circuit misfires for one half line cycle $T_{HL}$. At time ti, a positive crossing occurs when the rectified voltage $V_{RECT}$ 309 increases from zero. As illustrated, multiple reversals can be seen on the waveform of the rectified voltage $V_{RECT}$ 309 due to the dimmer circuit misfiring. At time $t_2$, the rectified voltage $V_{RECT}$ 309 falls below the second threshold $V_2$. At time $t_3$, the rectified voltage $V_{RECT}$ 309 increases above the first threshold $V_1$ and second threshold $V_2$. The positive crossing and half line frequency may be incorrectly sensed at time $t_3$ if threshold detection was used.

Figure 4A:
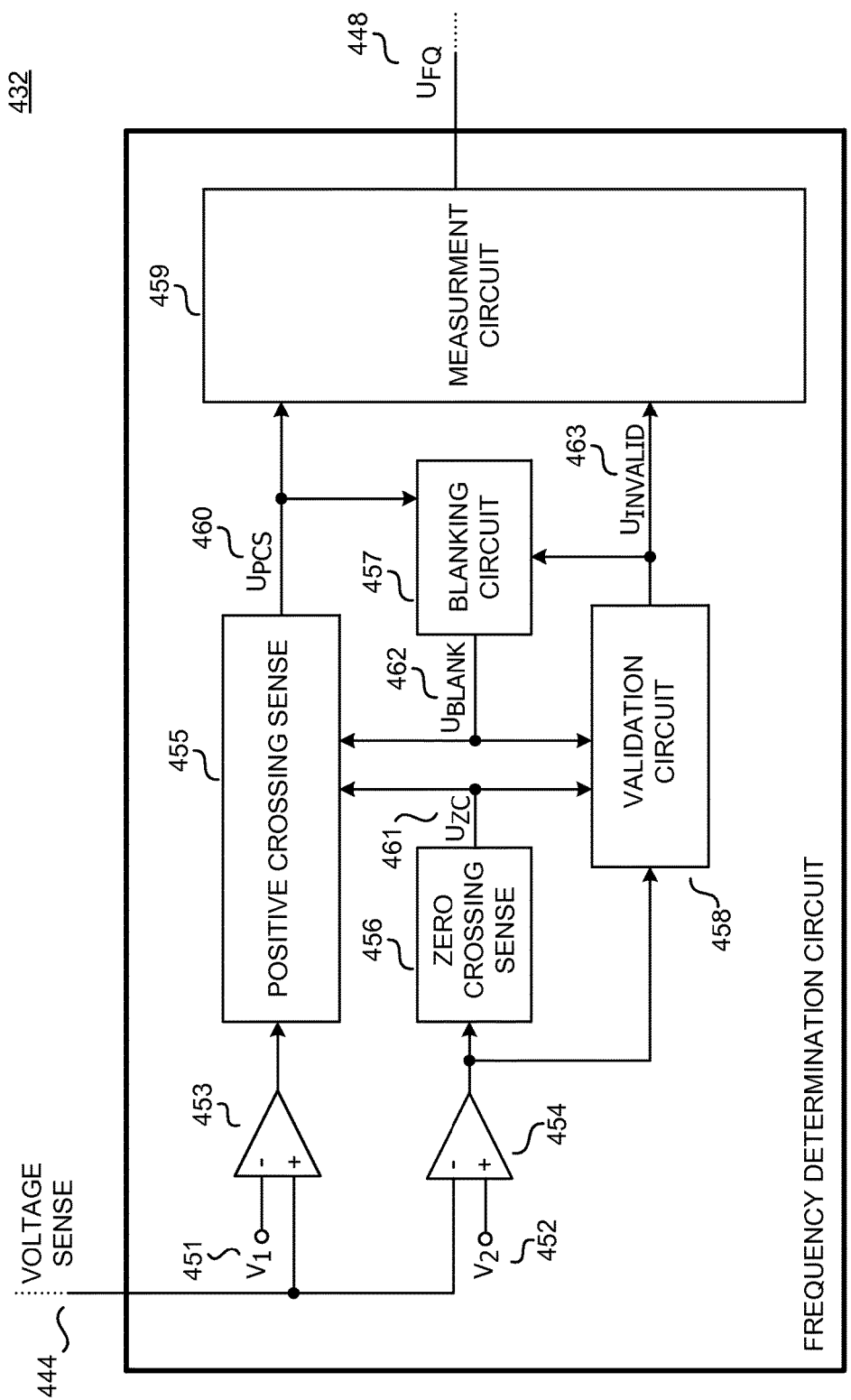
FIG. 4A a block diagram illustrating an example line frequency determination circuit of the controller of FIG. 1, in accordance with an example of the present invention.

FIG. 4A illustrates an example frequency determination circuit 432 including comparators 453 and 454, a positive crossing sense circuit 455, a zero crossing sense circuit 456, a blanking circuit 457, a validation circuit 458 and a measurement circuit 459. Further illustrated in FIG. 4A is the voltage sense signal 444, frequency signal $U_{FQ}$ 448, first threshold $V_1$ 451, second threshold $V_2$ 452, positive crossing signal $U_{PCS}$ 460, zero crossing signal $U_{ZC}$ 461, blanking signal $U_{BLANK}$ 462, and an invalid signal $U_{INVALID}$ 463.

Comparators 453 and 454 are coupled to receive the voltage sense signal 444, which may be representative of the rectified voltage $V_{RECT}$. Comparator 453 may also be coupled to receive the first threshold $V_1$ 451. In particular, the voltage sense signal 444 is received at the non-inverting input while the first threshold $V_1$ 451 is received at the inverting input of comparator 453. The output of comparator 453 is coupled to the positive crossing sense circuit 455. In operation, the output of comparator 453 is logic high when the voltage sense signal 444 (i.e., rectified voltage $V_{RECT}$) is greater than the first threshold $V_1$ 451. Comparator 454 is also coupled to receive the second threshold $V_2$ 452. In particular, the voltage sense signal 444 is received at the inverting input while the second threshold $V_2$ 452 is received at the non-inverting input. The output of comparator 454 is coupled to the zero crossing sense circuit 456 and the validation circuit 458. In operation, the output of comparator 454 is logic high when the voltage sense signal 444 (i.e., rectified voltage $V_{RECT}$) is less than the second threshold $V_2$ 452.

The zero crossing sense circuit 456 outputs the zero crossing signal $U_{ZC}$ 461 in response to the output of comparator 454. The zero crossing signal $U_{ZC}$ 461 may be a rectangular pulse waveform of varying lengths of logic high and logic low sections. In one example, the zero crossings sense circuit 456 outputs a logic high value when a zero crossing has been sensed. In operation, the zero crossing may be sensed when the voltage sense signal 444 is less than a second threshold $V_2$ 452 for a minimum duration of time substantially equal to a second amount of time (Y clock cycles). The value for the second amount of time (and as such the Y number of clock cycles) may be chosen as the amount of time that the voltage sense signal 444 is less than a second threshold $V_2$ 452 when the dimmer circuit is in full conduction. In one example, the second amount of time may be 35 system clock cycles. The zero crossing signal $U_{ZC}$ 461 may be received by the positive crossing sense circuit 455 and the validation circuit 458.

The positive crossing sense circuit 455 is coupled to receive the output of comparator 453, zero crossing signal $U_{ZC}$ 461, and the blanking signal $U_{BLANK}$ 462, and outputs the positive crossing signal $U_{PCS}$ 460. In one example, the positive crossing sense signal $U_{PCS}$ 460 is a pulse signal that pulses to a logic high value (and quickly falls to a logic low value) when a positive crossing is sensed. The positive crossing may be determined when the voltage sense signal 455 is greater than a first threshold $V_1$ 451 after the first amount of time (blanking time, X cycles) has passed since the previous sensed positive crossing and a zero crossing has been sensed. The first amount of time (X system clock cycles) may be selected as a duration that is less than the shortest half line period expected. In one example, the first amount of time may be 285 system clock cycles.

The blanking time may be provided by the blanking circuit 457. The blanking signal $U_{BLANK}$ 462 is a rectangular pulse waveform with varying lengths of logic high and logic low sections. In one example, the blanking signal $U_{BLANK}$ 462 prevents the positive crossing sense circuit 455 from responding to the output of comparator 453 and/or the zero crossing signal $U_{ZC}$ 461. In one example, the blanking signal $U_{BLANK}$ 462 is output in response to the positive crossing signal $U_{PCS}$ 460. When the positive crossing signal $U_{PCS}$ 460 indicates that a pulse has been sensed, the blanking circuit 457 outputs the blanking signal $U_{BLANK}$ 462 to prevent the positive crossing sense circuit 455 from responding to the comparator 453 for the first amount of time (blanking time, X cycles). The blanking circuit 457 may also be coupled to respond to the invalid signal $U_{INVALID}$ 463. As will be further discussed, the invalid signal $U_{INVALID}$ 463 outputs a pulse when the validation circuit 458 determines that a positive crossing is invalid. As such, the blanking circuit 457 re-enables the positive crossing sense circuit 455 to sense a positive crossing in response to the invalid signal $U_{INVALID}$ 463.

The validation circuit 458 is coupled to receive the zero crossing signal $U_{ZC}$ 461, blanking signal $U_{BLANK}$ 462, and the output of comparator 454 and outputs the invalid signal $U_{INVALID}$ 463. Similar to the positive crossing sense signal $U_{PCS}$ 460, the invalid signal $U_{INVALID}$ 463 is a pulse signal which pulses to a logic high value (and quickly falls to a logic low value) when the validation circuit 458 determines that the most recent pulse in the positive crossing sense signal $U_{PCS}$ 460 is invalid. The validation circuit 458 determines that the most recent pulse in the positive crossing sense signal $U_{PCS}$ 460 is invalid when another zero crossing is sensed by the zero crossing sense circuit 456 before the third amount of time (Z cycles) has passed. The third amount of time may be selected as greater than the duration between two validated zero crossings at the highest possible oscillator frequency. Further, the third amount of time may be selected as less than the duration between a valid zero cross and the zero crossing of the next half line cycle. In one example, the third amount of time may be substantially 80 system clock cycles. When the zero crossing sense circuit 456 indicates that a zero crossing has been sensed, the validation circuit 458 enables a counter begins the counter/timer. The counter/timer may be reset by the blanking signal $U_{BLANK}$ 462 or the output of comparator 454. If the counter/timer reaches the third amount of time (Z cycles) and another zero crossing was not sensed by the zero crossing sense circuit 456, the previous zero crossing and positive crossing are valid.

Measurement circuit 459 is coupled to receive the positive crossing signal $U_{PCS}$ 460 and the invalid signal $U_{INVALID}$ 463 and outputs the frequency signal $U_{FQ}$ 448. The frequency signal $U_{FQ}$ 448 may be representative of the frequency of the voltage sense signal 444. For the example when the voltage sense signal 444 is representative of the rectified voltage $V_{RECT}$, the frequency signal $U_{FQ}$ 448 may be representative of the half line frequency and half line cycle $T_{HL}$. In one example, the frequency signal $U_{FQ}$ 448 is a digital signal. In operation, the measurement circuit 459 measures the time between pulses in the positive crossing signal $U_{PCS}$ 460. When a pulse in the positive crossing signal $U_{PCS}$ 460 is received, the measurement circuit 459 saves and outputs the measured value as the frequency signal $U_{FQ}$ 448. The measurement circuit 459 then resets the measurement value. However, a pulse in the invalid signal $U_{INVALID}$ 463 indicates that the previous measurement (i.e., frequency signal $U_{FQ}$ 448) is incorrect. In response to the invalid signal $U_{INVALID}$ 463, the measurement circuit 459 adds the value of the frequency signal $U_{FQ}$ to the current measured value of the measurement circuit 459. The measurement circuit 459 continues measuring until the next pulse in the positive crossing signal $U_{PCS}$ 460.

Figure 4B:
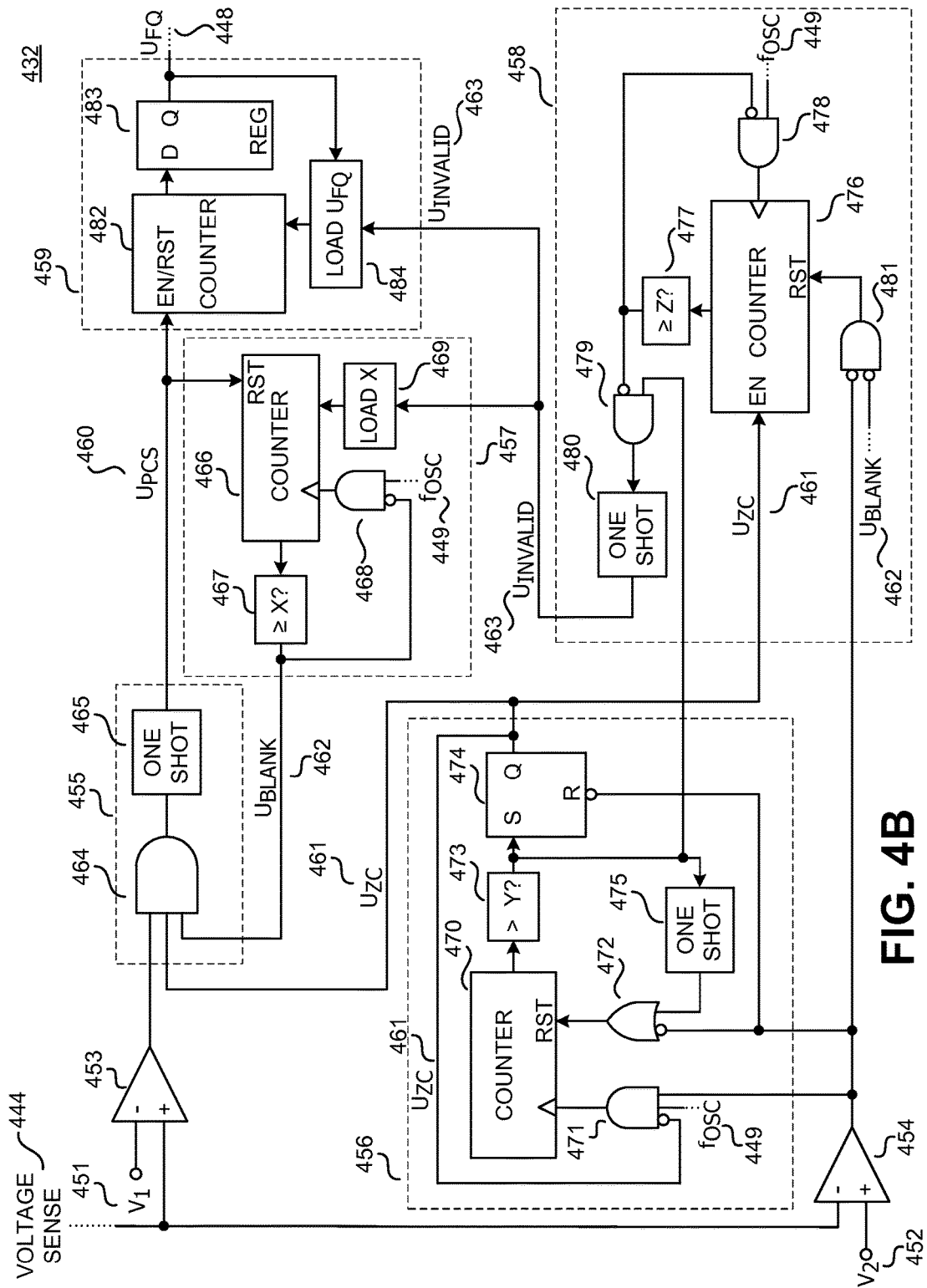
FIG. 4B is a schematic of the example line frequency determination circuit of FIG. 4A, in accordance with an example of the present invention.

FIG. 4B further illustrates one example frequency measurement circuit 432 of FIG. 4A in greater detail. Similar to FIG. 4A, FIG. 4B is shown as including comparators 453, and 454, positive crossing sense circuit 455, zero crossing sense circuit 456, blanking circuit 457, validation circuit 458 and measurement circuit 459. The positive crossing sense circuit 455 is shown as including an AND gate 464 and monostable multivibrator 465 (also referred to as a one shot 465). Zero crossing sense circuit 456 includes counter 470, AND gate 471, OR gate 472, comparator 473, latch 474, and one shot 475. Blanking circuit 457 is shown as including a counter 466, a comparator 467, an AND gate 468, and a loading circuit 469. Validation circuit 458 includes counter 476, comparator 477, AND gates 478 and 479, one shot 480 and AND gate 481. The measurement circuit 459 includes counter 482, register 483, and load circuit 484. Further illustrated in FIG. 4B is the voltage sense signal 444, first threshold $V_1$ 451, second threshold $V_2$ 452, positive crossing signal $U_{PCS}$ 460, zero crossing signal $U_{ZC}$ 461, blanking signal $U_{BLANK}$ 462, invalid signal $U_{INVALID}$ 463, frequency signal $U_{FQ}$ 448, and system clock $f_{OSC}$ 449.

The positive crossing sense circuit 455 includes AND gate 464, which is coupled to receive the output of comparator 453, the blanking signal $U_{BLANK}$ 462, and the zero crossing signal $U_{ZC}$ 461. The output of the AND gate 464 is coupled to the input of one shot 465, and the output of the one shot 465 is the positive crossing signal $U_{PCS}$ 460. In operation, the AND gate 464 outputs a logic high value when all of its inputs are logic high. In other words, the AND gate 464 outputs a logic high value when the voltage sense signal 444 is greater than the first threshold $V_1$ 451, the blanking signal $U_{BLANK}$ 462 indicates that the blanking time (X cycles) is over, and the zero crossing signal $U_{ZC}$ 461 indicates that a zero crossing has been sensed. The one shot circuit 465 outputs a pulse in response to a rising edge at its input (the output of AND gate 464). As such, the positive crossing signal $U_{PCS}$ 460 pulses to a logic high value when the voltage sense signal 444 is greater than the first threshold $V_1$ 451, the blanking signal $U_{BLANK}$ 462 indicates that the blanking time (X system clock cycles) is over, and the zero crossing signal $U_{ZC}$ 461 indicates that a zero crossing has been sensed.

As mentioned above, the blanking circuit 457 outputs the blanking signal $U_{BLANK}$ 462 to prevent the positive crossing sense circuit 455 from responding to the output of comparator 453. Further, the blanking signal $U_{BLANK}$ 462 prevents the positive crossing sense circuit 455 from responding for X system clock cycles after a pulse in the positive crossing signal $U_{PCS}$ 460. In one example, a logic low value for the blanking signal $U_{BLANK}$ 462 prevents the positive crossing sense circuit 455 from responding. The duration of time that the blanking signal $U_{BLANK}$ 462 is logic low may be referred to as the blanking time. As illustrated, the counter 466 is coupled to receive the positive crossing signal $U_{PCS}$ 460 at its reset input. The counter 466 is further coupled to receive the output of AND gate 468 at its clock input. The counter 466 is further coupled to be loaded with the value X by the loading circuit 469 in response to the invalid signal $U_{INVALID}$ 463. The internal count of the counter 466 is received by the comparator 467 and is compared to the value X. The value X is representative of the first time period, or the X system clock cycles of the blanking time. The comparator 467 outputs a logic high value when the internal count of the counter 466 is greater than or equal to X. AND gate 468 is coupled to receive the inverted output of the comparator 467 (as indicated with the small circle at the input of the AND gate 468) and the system clock 449. The output of the AND gate 468 determines how quickly the counter 466 increments or decrements its internal count.

In operation, the internal count of the counter resets to zero when the positive crossing signal $U_{PCS}$ 460 pulses to a logic high value indicating that a positive pulse has been sensed. The counter increments with every leading edge of the output of the AND gate 468. In one example, the system clock $f_{OSC}$ 449 is a pulsing waveform with the time between leading edges substantially equal to the oscillator period $T_{OSC}$. As such, the counter increments at the speed of the system clock $f_{OSC}$ 449 when the output of comparator 467 is logic low (i.e., the internal count of the counter 466 is less than X). When the internal count of the counter 466 reaches X, the counter 466 stops counting. Further, the blanking signal $U_{BLANK}$ 462 transitions to a logic high value indicating that the blanking time is over. In addition, the loading circuit 469 loads the counter 466 with the value X in response to a leading edge (or pulse) in the invalid signal $U_{INVALID}$ 463. As such, the output of comparator 467 is a logic high value and the blanking signal $U_{BLANK}$ 462 does not prevent the positive crossing sense signal 455 from responding to the output of comparator 453.

The zero crossing sense circuit 456 outputs a logic high value for the zero crossing signal $U_{ZC}$ 461 when a zero crossing is sensed in the voltage sense signal 444 (rectified voltage $V_{RECT}$). As mentioned above, a zero crossing is sensed when the voltage sense signal 444 (rectified voltage $V_{RECT}$) is less than the second reference $V_2$ 454 for at least the second amount of time (Y system clock cycles). Illustrated in FIG. 4B, the counter 470 is coupled to receive the output of AND gate 471 at its clock input and the output of OR gate 472 at its reset input. The internal count is the output of counter 470 is coupled to the comparator 473 and compared to the value Y, which is representative of the Y system clock cycles. The output of the counter 473 is coupled to be received by both the latch 474 (at the set input) and the one shot 475. As illustrated, the Q-output of the latch 474 is the zero crossing signal $U_{ZC}$ 474. AND gate 471 is coupled to receive the output of comparator 454, the inverted zero crossing signal $U_{ZC}$ 474 (as shown by the small circle at the input of AND gate 471), and the system clock $f_{OSC}$ 449. The OR gate 472 is coupled to receive the inverted output of comparator 454 (as indicated with the small circle at the input of OR gate 472) and the output of the one shot 475. Further, the latch 474 is reset by the inverted output of comparator 454 (as indicated with the small circle at the reset input of latch 474).

In operation, the counter 470 increments its internal count with the leading edges of the system clock $f_{OSC}$ 449 when the voltage sense signal 444 (rectified voltage $V_{RECT}$) is less than the second threshold $V_2$ 452 (output of comparator 454 is logic high) and the zero crossing signal $U_{ZC}$ 461 indicates that the zero crossing has not been sensed (zero crossing signal $U_{ZC}$ 461 is logic low). The internal count of counter 470 may be reset when the internal count is greater than Y or when the voltage sense signal 444 (rectified voltage $V_{RECT}$) is greater than the second threshold $V_2$ 452 (output of comparator 454 is logic low). Further, the zero crossing signal $U_{ZC}$ 461 transitions to a logic high value when the output of comparator 473 is logic high, indicating that the internal count of the counter 470 is greater than Y.

If the zero crossing hasn't been sensed yet (zero crossing signal $U_{ZC}$ 461 is logic low), the counter 470 increments its internal count when the voltage sense signal 444 (rectified voltage $V_{RECT}$) is less than the second threshold $V_2$ 452. If the voltage sense signal 444 (rectified voltage $V_{RECT}$) exceeds the second threshold $V_2$ 452 prior to the internal count of counter 470 reaching Y, the counter 470 is reset to zero and does not increment its internal count until the voltage sense signal 444 falls below the second threshold $V_2$ 452. However, if the voltage sense signal 444 stays below the second threshold $V_2$ 452 such that the internal count of counter 470 exceeds Y, the latch 474 is set and the zero crossing signal $U_{ZC}$ 461 transitions to a logic high value. Once the internal count of counter 470 exceeds Y, the comparator 473 triggers the one shot 475 and the counter 470 is reset. In addition, the zero crossing signal $U_{ZC}$ 461 is now logic high and the output of AND gate 471 is logic low and the counter 470 does not increment. If the voltage sense signal exceeds the second threshold $V_2$ 452, the latch 474 is reset and the zero crossing signal $U_{ZC}$ 461 transitions to a logic low value. Once the zero crossing signal $U_{ZC}$ 461 is logic low, the counter 471 may increment when the voltage sense signal falls below the second threshold $V_2$ 452.

The validation circuit 458 outputs the invalid signal $U_{INVALID}$ 463 indicating whether the last sensed positive crossing (i.e., the last pulse in the positive crossing signal $U_{PCS}$ 460) and the last sensed zero crossing is valid. If it is determined invalid, the invalid signal $U_{INVALID}$ 463 pulses to a logic high value. The validation circuit 458 determines that the last sensed positive crossing is invalid when a second zero crossing (i.e., the voltage sense signal 444 is less than the second threshold $V_2$ for Y system clock cycles) is sensed before Z system clock cycles have elapsed since the first zero crossing. The counter 476 is coupled to receive the zero crossing signal $U_{ZC}$ 461 at its enable input, the output of AND gate 481 at its reset input, and the output of AND gate 478 at its clock input. The internal count of the counter 476 is output to the comparator 477 and compared to the value Z, which is representative of the Z system clock cycles. AND gate 478 is coupled to receive the inverted output of comparator 477 (as indicated with the small circle at the input of AND gate 478) and the system clock $f_{OSC}$ 449. AND gate 481 is coupled to receive the inverted output of comparator 454 and the inverted blanking signal $U_{BLANK}$ 462 (as indicated with the circles at both inputs of AND gate 481). The inverted output of comparator 477 is also received by AND gate 479 (as indicated with the small circle). The AND gate 479 also receives the output of comparator 473 of the zero crossing sense circuit 456. The output of comparator 473 also indicates that the voltage sense signal 444 is less than the second threshold $V_2$ for Y system clock cycles. One shot 480 is coupled to receive the output of AND gate 479 and outputs the invalid signal $U_{INVALID}$ 463.

In operation, the counter 476 begins incrementing its internal count (i.e., is enabled) at the leading edge of the zero crossing signal $U_{ZC}$ 461 (i.e., when the zero crossing signal $U_{ZC}$ 461 transitions to a logic high value). The counter 476 continues incrementing at the leading edge of the output of AND gate 478. As shown, the counter 476 increments its internal count with the leading edge of the system clock $f_{OSC}$ 449 when the internal count of the counter is less than Z (output of comparator 477 is logic low). The counter 476 may be reset when the blanking signal $U_{BLANK}$ 462 is logic low and the voltage sense signal 444 is greater than the second threshold $V_2$ 452. The one shot 480 is triggered to output a pulse in the invalid signal $U_{INVALID}$ 463 when the output of comparator 473 is logic high (internal count of counter 470 is greater than Y) and the output of comparator 477 is logic low (internal count of counter 476 is less than Z) indicating that another zero crossing was sensed before the Z system clock cycles have elapsed since the counter 476 was enabled.

The measurement circuit 459 measures the time between pulses (in particular, the time between leading edges) in the positive crossing signal $U_{PCS}$ 460. The counter 482 is coupled to receive the positive crossing signal $U_{PCS}$ 460 at its enable and reset input. The output of the counter 482 is coupled to the input of the register 483. As shown, the output of the register 483 is the frequency signal $U_{FQ}$ 448. Loading circuit 484 is coupled to receive the frequency signal $U_{FQ}$ 448 and the invalid signal $U_{INVALID}$ 463. The output of the loading circuit 484 is received by the counter 482.

In operation, when the counter 482 receives a pulse in the positive crossing signal $U_{PCS}$ 460, the counter 482 outputs its internal count to the register 483. The register 483 saves the internal count and outputs the internal count as the frequency signal $U_{FQ}$ 448. The frequency signal $U_{FQ}$ 448 is also saved to the loading circuit 484. The counter 482 then resets to zero and begins incrementing its internal count at the speed of the system clock $f_{OSC}$ 449 (clock input not shown). However, when a pulse in the invalid signal $U_{INVALID}$ 463, this indicates that the previous pulse in the positive crossing signal $U_{PCS}$ 460 was invalid and as such the current value for the frequency signal $U_{FQ}$ 448 is also invalid. As illustrated, the loading circuit 484 is coupled receive the invalid signal $U_{INVALID}$ 463 and loads the counter 482 with the current value of the frequency signal $U_{FQ}$ 448 in response to a pulse in the invalid signal $U_{INVALID}$ 463. The counter 482 adds the current value of the frequency signal $U_{FQ}$ 448 to its internal count and continues incrementing. As such, the frequency determination circuit 432 measures the frequency of the voltage sense signal 444.

Figure 5:
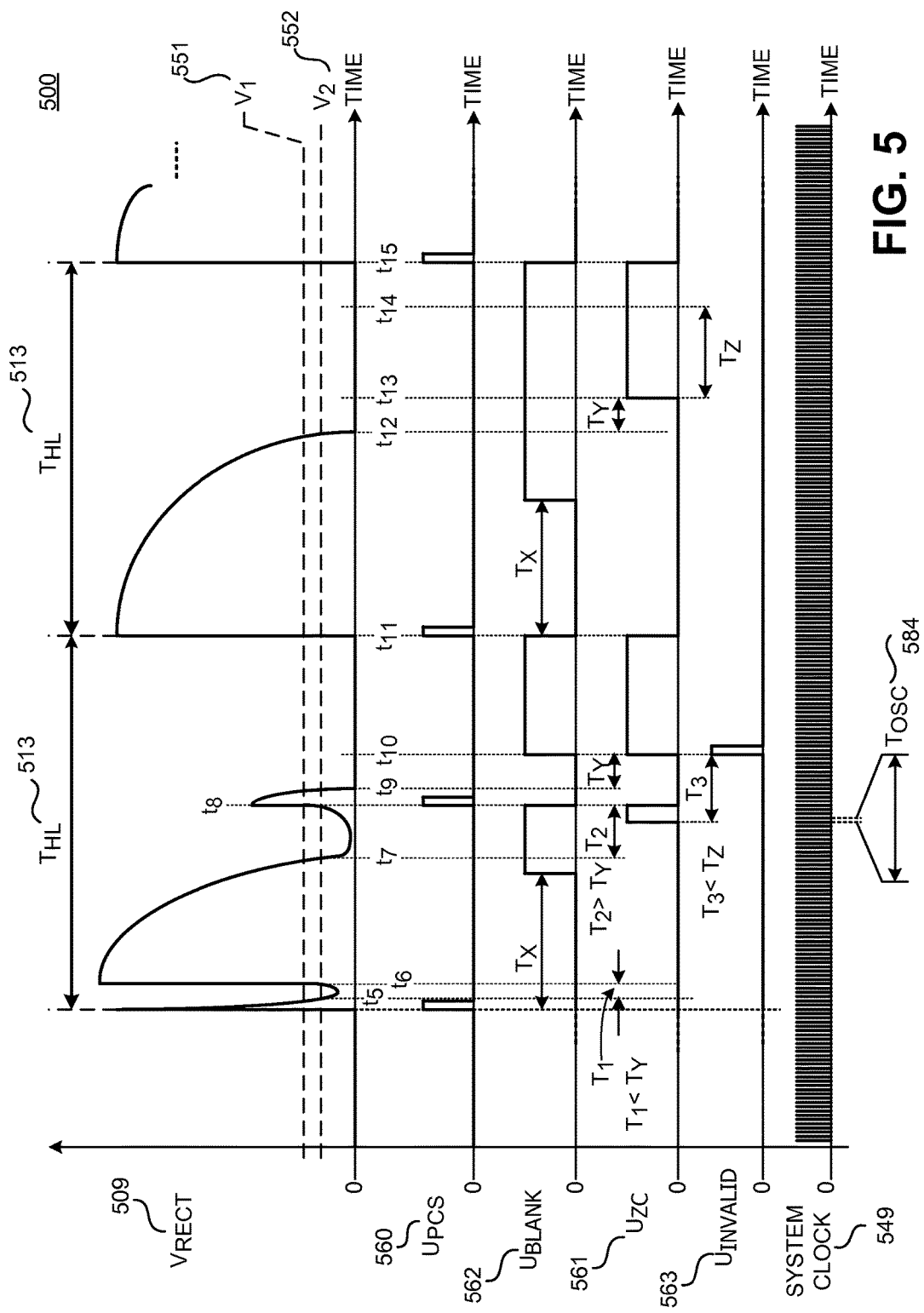
FIG. 5 is a timing diagram illustrating example waveforms of an output of a rectifier circuit and control signals of the line frequency measurement circuit of FIG. 4A and FIG. 4B in accordance with an example of the present invention.

FIG. 5 illustrates a timing diagram 500 including example waveforms for the rectified voltage $V_{RECT}$ 509, positive crossing signal $U_{PCS}$ 560, blanking signal $U_{BLANK}$ 562, zero crossing signal $U_{ZC}$ 561, invalid signal $U_{INVALID}$ 563, and system clock 549. As shown, the half line cycle $T_{HL}$ 513 of the rectified voltage $V_{RECT}$ 509 is substantially equal to the time between sensed positive crossings (pulses in the positive crossing signal $U_{PCS}$ 560). Further, the system clock 549 is characterized by an oscillation period $T_{OSC}$ 584, which is much shorter than the half line cycle $T_{HL}$ 513. In other words, the frequency of the system clock 549 is much faster than the half line frequency of the rectified voltage $V_{RECT}$ 509.

At the left hand side, the rectified voltage $V_{RECT}$ 509 increases above both the first threshold $V_1$ 551 and the second threshold $V_2$ 552 and the positive crossing signal $U_{PCS}$ 560 pulses to a logic high value indicating a positive pulse has been sensed and the blanking time $T_X$ (representative of X system clock cycles) begins (as illustrated by the logic low value for time $T_X$ in blanking signal $U_{BLANK}$ 562.

At time $t_5$, the rectified voltage $V_{RECT}$ 509 falls below the second threshold $V_2$ 552 and rises above the second threshold $V_2$ 552 at time $t_6$. This dip may be due to a misfiring dimmer circuit. The difference between time $t_6$ and time $t_5$ is denoted as period $T_1$. The period $T_1$ is less than a period $T_Y$ (representative of the Y system clock cycles) and as such the zero crossing sense circuit does not sense a zero crossing and the zero crossing signal $U_{ZC}$ 561 remains logic low. As such the positive crossing sense circuit does not detect a positive crossing.

At time $t_7$, rectified voltage $V_{RECT}$ 509 falls below the second threshold $V_2$ 552 and rises above the second threshold $V_2$ 552 at time $t_8$. This dip may be due to a misfiring dimmer circuit. The difference between time $t_8$ and time $t_7$ is denoted as period $T_2$. As shown, by time $t_7$, the blanking time $T_X$ for the blanking signal $U_{BLANK}$ 562 has elapsed and the blanking signal $U_{BLANK}$ 562 is logic high. The period $T_2$ is also greater than the period $T_Y$ (representative of the Y system clock cycles) and as such the zero crossing sense circuit senses a zero crossing and the zero crossing signal $U_{ZC}$ 561 transitions to a logic high value a period $T_Y$ after time $t_7$. At time $t_8$, the rectified voltage $V_{RECT}$ 509 also increases above the first threshold $V_1$ 551. As such, the positive crossing signal $U_{PCS}$ 560 transitions to a logic high value at time t8. Once the positive crossing signal $U_{PCS}$ 560 transitions to a logic high value, the blanking signal $U_{BLANKING}$ 562 starts the blanking time and transitions to a logic low value. Further, the zero crossing signal $U_{ZC}$ 561 resets and falls to a logic low value.

However, as illustrated, the positive crossing sensed at time $t_8$ is not the correct positive crossing (which is at time $t_{11}$). At time $t_9$, the rectified voltage $V_{RECT}$ 509 falls below the second threshold $V_2$ 552. The rectified voltage $V_{RECT}$ 509 stays below the second threshold $V_2$ 552 for a period $T_Y$ (shown as the difference between time $t_{10}$ and time $t_9$) and the zero crossing signal $U_{ZC}$ 561 transitions to a logic high value. The zero crossing signal $U_{ZC}$ 561 transitions to a logic high value a period $T_3$ from the previous leading edge of the zero crossing signal $U_{ZC}$ 561. As shown, the period $T_3$ is less than the period $T_Z$ (representative of the Z system clock cycles) and as such the validation circuit determines that the previous zero crossing sensed between time $t_7$ and $t_8$ was invalid and as such the positive crossing sensed at time $t_8$ is also invalid. As illustrated, the invalid signal $U_{INVALID}$ 563 pulses at time $t_{10}$. In response to the pulse in the invalid signal $U_{INVALID}$ 563, the blanking time for the blanking signal $U_{BLANK}$ 562 is ended at the blanking signal $U_{BLANK}$ 562 transitions to a logic high value, allowing the positive crossing sense circuit to respond to the comparison between the rectified voltage $V_{RECT}$ 509 and the first threshold $V_1$ 551. At time $t_{11}$, the rectified voltage $V_{RECT}$ 509 exceeds the first threshold $V_1$ 551 when both the blanking signal $U_{BLANK}$ 562 and the zero crossing signal $U_{ZC}$ 561 are logic high and the positive crossing sense circuit outputs a pulse in the positive crossing signal $U_{PCS}$ 560. In response to the pulse in the positive crossing signal $U_{PCS}$ 560, both the blanking signal $U_{BLANK}$ 562 and the zero crossing signal $U_{ZC}$ 561 fall to a logic low value.

The next half line cycle $T_{HL}$ 513 on the right hand side illustrates the signals when there is no misfire. A positive pulse is sensed at time $t_{11}$. At time $t_{12}$, the rectified voltage $V_{RECT}$ 509 falls below the second threshold $V_2$ 552 after the blanking time $T_X$ is over (and as such the blanking signal $U_{BLANK}$ 562 is logic high). Further, the rectified voltage $V_{RECT}$ 509 remains below the second threshold $V_2$ 552 for at least a period $T_Y$. As such at time $t_{13}$ (which is a period TY after time $t_{12}$), the zero crossing signal $U_{ZC}$ 561 transitions to a logic high value. At time $t_{14}$, a period $T_Z$ has elapsed without another zero crossing being sensed and as such the zero crossing sensed at time $t_{13}$ and the positive crossing sensed at time $t_{11}$ are validated. The positive crossing is sensed at time t15 when the rectified voltage $V_{RECT}$ 509 exceeds the first threshold $V_1$ 551 when both the blanking signal $U_{BLANK}$ 562 and the zero crossing signal $U_{ZC}$ 561 are logic high and the positive crossing sense circuit outputs a pulse in the positive crossing signal $U_{PCS}$ 560. In response to the pulse in the positive crossing signal $U_{PCS}$ 560, both the blanking signal $U_{BLANK}$ 562 and the zero crossing signal $U_{ZC}$ 561 fall to a logic low value.

Figure 6:
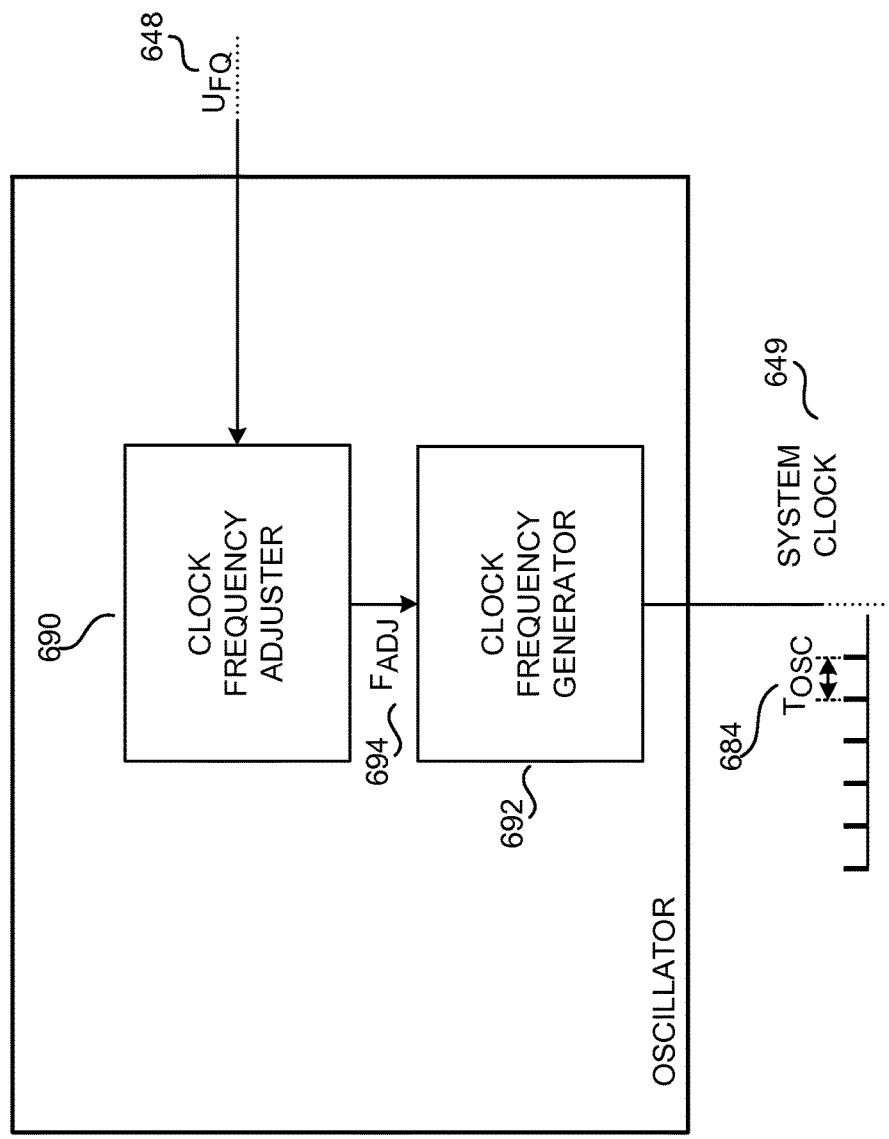
FIG. 6 is a block diagram illustrating an example oscillator of the controller of FIG. 1 in accordance with an example of the present invention.

FIG. 6 is a block diagram illustrating an example oscillator 734 including a clock frequency adjuster 690 and a clock frequency generator 692. Further illustrated in FIG. 6 is the frequency signal $U_{FQ}$ 648, the frequency adjust signal $F_{ADJ}$ 694, and the system clock 649. The oscillator 734 may be one example of a synchronized oscillator where the frequency and period $T_{OSC}$ 684 of the system clock 649 are synchronized to the frequency signal $U_{FQ}$ 648. In other words, the same number of oscillator periods $T_{OSC}$ 684 of the system clock 649 occur regardless of the duration of the period of the frequency signal $U_{FQ}$ 648.

As mentioned above, the frequency signal $U_{FQ}$ 648 may be representative of the period and frequency of the half line cycle of the rectified voltage $V_{RECT}$. Further, the frequency signal $U_{FQ}$ 648 may be a digital count signal indicting the length of the half line cycle of the rectified voltage $V_{RECT}$. The clock frequency adjuster 690 is coupled to receive the frequency signal $U_{FQ}$ 648 and may output the frequency adjust signal $F_{ADJ}$ 694 to the clock frequency generator 692. The clock frequency generator 692 outputs the system clock 649, and utilizes the frequency adjust signal $F_{ADJ}$ 694 to determine the length of the oscillator period $T_{OSC}$ 684.

In one example, a larger digital count for the frequency signal $U_{FQ}$ 648 may indicate that oscillator period $T_{OSC}$ 684 may be too short. As such, the frequency adjust signal $F_{ADJ}$ 694 indicates to the clock frequency generator 692 to increase the duration of the oscillator period $T_{OSC}$ 684 of the system clock and vice versa.

Figure 7:
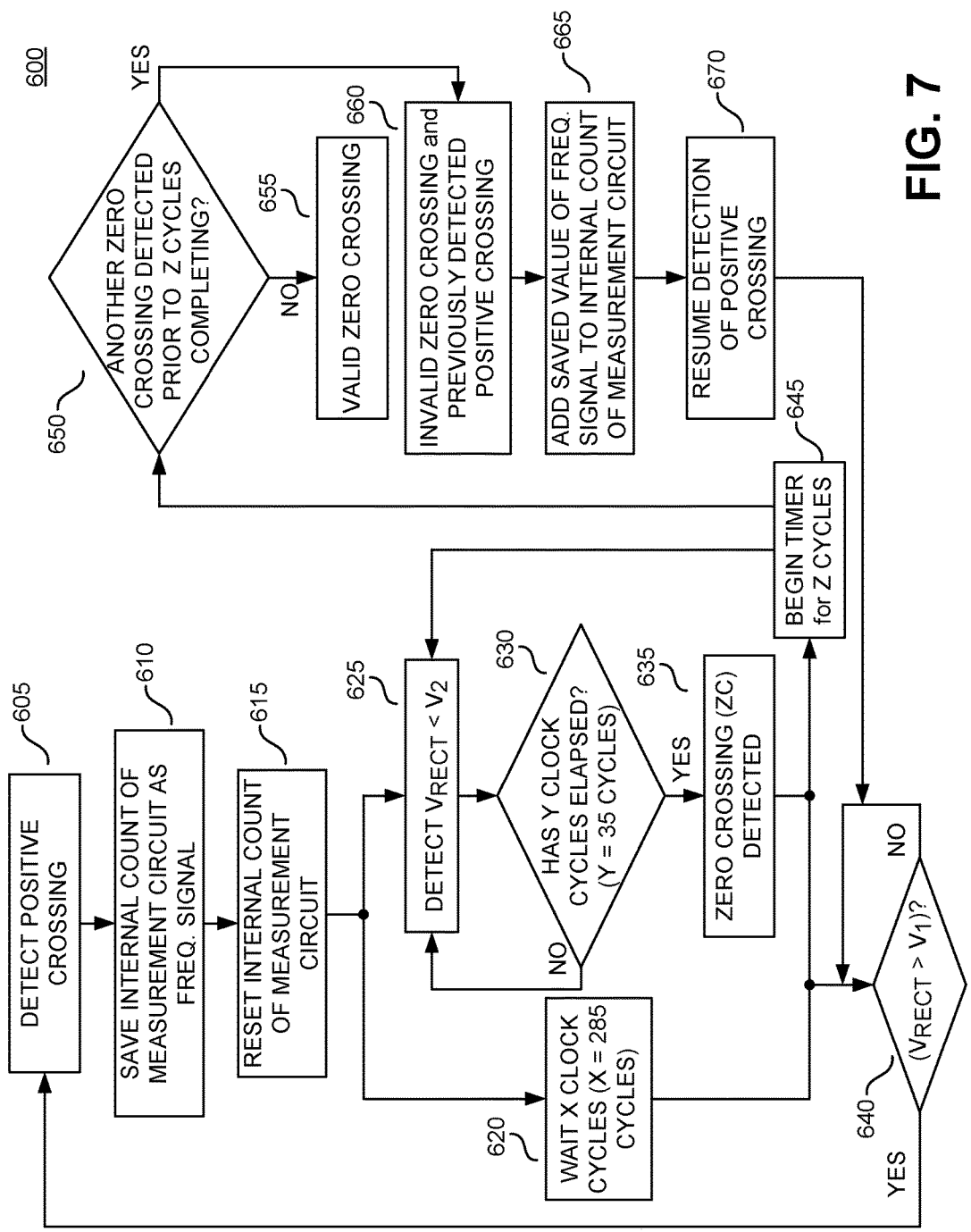
FIG. 7 is a flow chart illustrating an example method for determining a frequency in accordance with an example of the present invention.

FIG. 7 is a flow chart 600 illustrating an example method for measuring the frequency of an input signal. At block 605, a positive crossing is detected. At block 610, in response to the detected positive crossing, the internal count of a measurement circuit is saved as the frequency signal. Next, the process goes to block 615 where the internal count of the measurement circuit is now reset. At this point, the process proceeds to both block 620 and block 625. At block 620, the process waits for X clock cycles. At block 625, the process detects if the rectified voltage $V_{RECT}$ is less than the second threshold $V_2$. At block 630, it is determined if Y clock cycles have elapsed. If Y clock cycles have not elapsed, the process returns to block 625. If Y clock cycles have elapsed, the process moves on to block 635 and a zero crossing is detected. At block 640, if the rectified voltage $V_{RECT}$ is greater than the first threshold $V_1$ after the processes in blocks 620, 625, 630 and 635 have been completed, then the process returns to block 605 and a positive crossing has been detected. If not, the process returns to the start of block 640.

Further, after block 635, the process also continues to block 645 where a timer for Z cycles is started. At block 650, it is determined if another zero crossing was detected prior to Z system clock cycles completing. If the answer is no, the process proceeds to block 655 and the previous zero crossing is valid. If the answer is yes, the process proceeds to block 660 and the previous zero crossing and positive crossing is invalid. At block 665, the saved value of the frequency signal is added to the internal count of the measurement circuit. At block 670, the process resumes detection of the positive crossing signal and removes any blanking time and then returns to block 640.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. A frequency determination circuit comprising:
a positive crossing sense circuit coupled to sense a positive crossing of an input voltage coupled to be received from a dimmer circuit in response to the input voltage being greater than a first threshold voltage after a first threshold number of cycles has passed and after a zero crossing of the input voltage, wherein the zero crossing of the input voltage is detected in response to the input voltage being less than a second threshold voltage for a second threshold number of cycles;
a validation circuit coupled to the positive crossing sense circuit to validate a previous zero crossing and the positive crossing of the input voltage after the positive crossing of the of the input voltage has occurred, wherein the validation circuit is coupled to sense an invalid previous zero crossing and positive crossing of the input voltage in response to sensing another zero crossing of the input voltage before an end of a third threshold number of cycles; and
a measurement circuit coupled to the positive crossing sense circuit and the validation circuit to count a time between positive crossing pulses of the input voltage, wherein the measurement circuit includes a measurement counter coupled to a measurement register, wherein a measurement count of the measurement counter is coupled to be saved in the measurement register and wherein the measurement counter is coupled to be reset in response to each positive crossing pulse that is received from the positive crossing sense circuit, wherein an output signal of the measurement register is representative of a frequency of the input voltage.

2. The frequency determination circuit of claim 1 wherein the measurement circuit is coupled to invalidate a value saved in the measurement register in response to receiving an invalid signal asserted by the validation circuit.

3. The frequency determination circuit of claim 1 wherein a value saved in the measurement register is coupled to be added to the measurement count of the measurement counter in response to the validation circuit, wherein the validation circuit is coupled to enable the positive crossing sense circuit to sense a positive crossing without waiting the first threshold number of cycles.

4. The frequency determination circuit of claim 1 further comprising a first comparator coupled to compare the input voltage and the first threshold voltage, wherein an output of the first comparator is coupled to be received by the positive crossing sense circuit.

5. The frequency determination circuit of claim 1 wherein the positive crossing sense circuit comprises a first one shot circuit coupled to be responsive to the output of the first comparator and the zero crossing of the input voltage after the first threshold number of cycles has passed after a previous sensed positive crossing of the input voltage.

6. The frequency determination circuit of claim 1 further comprising a second comparator coupled to compare the input voltage and the second threshold voltage, wherein an output of the second comparator is coupled to be received by the positive crossing sense circuit.

7. The frequency determination circuit of claim 6 further comprising a zero crossing sense circuit coupled to receive the output of the second comparator to sense a zero crossing of the input voltage, wherein a zero crossing output of the zero crossing sense circuit is coupled to be received by the positive crossing sense circuit and the validation circuit.

8. The frequency determination circuit of claim 7 wherein the zero crossing sense circuit comprises:
a first counter circuit coupled to be clocked in response to an oscillating signal and the output of the output of the second comparator;
a latch coupled to be set in response to an output of the first counter circuit representing a first count greater than the second threshold number of cycles, wherein the latch is coupled to be reset in response to the output of the output of the second comparator, wherein the first counter circuit is further coupled to be clocked in response to an output of the latch; and
a second one shot circuit coupled to be responsive to the output of the first counter circuit representing the first count greater than the second threshold number of cycles, wherein the first counter circuit is further coupled to be reset in response to an output of the second one shot circuit or the output of the second comparator.

9. The frequency determination circuit of claim 7 further comprising a blanking circuit coupled to receive positive crossing pulses from the positive crossing sense circuit, wherein a blanking signal is coupled to be output by the blanking circuit that is coupled to be received by the positive crossing sense circuit and the validation circuit.

10. The frequency determination circuit of claim 9 wherein the blanking circuit further comprises a second counter circuit coupled to be responsive to the positive crossing pulses from the positive crossing sense circuit, wherein the second counter circuit is coupled to be reset in response to the positive crossing pulses from the positive crossing sense circuit, wherein the blanking signal is coupled to be responsive to an output of the second counter circuit representing a second count greater than or equal to the first threshold number of cycles, and wherein the second counter circuit is coupled to be clocked in response to the oscillating signal and the blanking signal.

11. The frequency determination circuit of claim 10, wherein the blanking circuit is further coupled responsive to an invalid signal asserted by the validation circuit, wherein the second counter circuit is coupled to be loaded with the first threshold number of cycles when the validation circuit determines that a previous positive pulse is invalid.

12. The frequency determination circuit of claim 9 wherein the validation circuit comprises:
a third counter circuit coupled to be enabled in response to zero crossing output of the zero crossing sense circuit, wherein the third counter circuit is coupled to be reset in response to the blanking signal output by the blanking circuit and the output of the second comparator, and wherein the third counter circuit is coupled to be clocked in response to the oscillating signal and an output of the third counter representing a third count greater than or equal to the third threshold number of cycles; and a third one shot circuit coupled to be responsive to the output of the third counter representing the a third count greater than or equal to the third threshold number of cycles and the output of the first counter circuit representing the first count greater than the second threshold number of cycles, wherein the invalid signal asserted by the validation circuit is coupled to be output in response to the third one shot circuit.

13. A method of measuring a frequency of an input voltage, comprising:

detecting a positive crossing of the input voltage;

outputting and saving an internal count of a measurement circuit as a frequency signal;

resetting the internal count of the measurement circuit after said outputting and saving the internal count of the measurement circuit;

detecting a zero crossing in response detecting the input voltage is less than a second threshold voltage for a second threshold number of clock cycles;

waiting a first threshold number of cycles while said detecting the zero crossing;

waiting until the input voltage is greater than a first threshold voltage before detecting another positive crossing of the input voltage;

beginning a timer for a third threshold number of cycles;

validating a zero crossing in response to no further zero crossings of the input voltage being detected within the third threshold number of cycles; and invalidating the zero crossing and the previously detected positive crossing in response to another zero crossing of the input voltage being detected within the third threshold number of cycles, and adding a saved value of the frequency signal to the internal count of the measurement circuit.

14. The method of claim 13 further comprising resuming detection of a positive crossing of the input voltage after said adding the saved value of the frequency signal to the internal count of the measurement circuit.

15. The method of claim 13 wherein the first threshold number of cycles is 285 cycles.

16. The method of claim 13 wherein the second threshold number of cycles is 35 cycles.

17. A power converter, comprising:

a rectifier coupled to a dimmer circuit coupled to receive a line voltage;

an energy transfer element having an input coupled to receive an input voltage from the rectifier, wherein an output of the energy transfer element is coupled to an output of the power converter;

a power switch coupled to the input of the power converter; and a controller coupled to generate a drive signal coupled to control switching of the power switch to control of transfer of energy through the energy transfer element to the output of the power converter, wherein the controller includes:

an oscillator circuit coupled to generate a system clock in response to a frequency signal;

a drive circuit coupled to generate the drive signal in response to a feedback signal representative of an output of the power converter, the system clock, and the frequency signal; and a frequency determination circuit coupled to generate the frequency signal in response to a voltage sense signal representative of the input voltage, wherein the frequency determination circuit includes:

a positive crossing sense circuit coupled to sense a positive crossing of the input voltage in response to the input voltage being greater than a first threshold voltage after a first threshold number of cycles has passed after a zero crossing of the input voltage, wherein the zero crossing of the input voltage is detected in response to the input voltage being less than a second threshold voltage for a second threshold number of cycles;

a validation circuit coupled to the positive crossing sense circuit to validate a previous zero crossing and the positive crossing of the input voltage after the positive crossing of the of the input voltage has occurred, wherein the validation circuit is coupled to sense an invalid previous zero crossing and positive crossing of the input voltage in response to sensing another zero crossing of the input voltage before an end of a third threshold number of cycles; and a measurement circuit coupled to the positive crossing sense circuit and the validation circuit to count a time between positive crossing pulses of the input voltage, wherein the measurement circuit includes a measurement counter coupled to a measurement register, wherein a measurement count of the measurement counter is coupled to be saved in the measurement register and wherein the measurement counter is coupled to be reset in response to each positive crossing pulse that is received from the positive crossing sense circuit, wherein the frequency signal of the measurement register is representative of a frequency of the input voltage.

18. The power converter of claim 17 wherein the oscillator circuit comprises:

a clock frequency adjuster coupled to output a frequency adjustment signal in response to the frequency signal; and a clock frequency generator coupled to generate the system clock signal in response to the frequency adjustment signal.

19. The power converter of claim 17 further comprising a filter capacitor coupled to an output of the rectifier to filter the input voltage.

20. The power converter of claim 17 further comprising a clamp circuit coupled to the input of the energy transfer element to clamp a voltage across the input of the energy transfer element.

21. The power converter of claim 17 further comprising an output capacitor coupled to the output of the energy transfer element to provide an output voltage of the power converter.

22. The power converter of claim 17 further comprising a sense circuit responsive to the output of the power converter to provide the feedback signal representative of the output of the power converter.

23. A frequency determination circuit, comprising:
a positive crossing sense circuit coupled to receive an input voltage to sense a positive crossing of an input voltage;
a validation circuit coupled to the positive crossing sense circuit to validate a previous zero crossing and the positive crossing of the input voltage after the positive crossing of the of the input voltage has occurred; and
a measurement circuit coupled to the positive crossing sense circuit and the validation circuit to count a time between positive crossing pulses of the input voltage, wherein the measurement circuit is coupled to output a frequency signal representative of a frequency of the input voltage in response to the time between the positive crossing pulses of the input voltage.

24. The frequency determination circuit of claim 23 wherein the input voltage is a rectified voltage coupled to be received from a dimmer circuit.

25. The frequency determination circuit of claim 23 wherein the positive crossing sense circuit is coupled to sense the positive crossing of the input voltage in response to the input voltage being greater than a first threshold voltage after a first threshold number of cycles has passed and after a zero crossing of the input voltage.

26. The frequency determination circuit of claim 25 wherein the zero crossing of the input voltage is coupled to be detected in response to the input voltage being less than a second threshold voltage for a second threshold number of cycles.

27. The frequency determination circuit of claim 23 wherein the validation circuit is coupled to sense an invalid previous zero crossing and positive crossing of the input voltage in response to sensing another zero crossing of the input voltage before an end of a third threshold number of cycles.

28. The frequency determination circuit of claim 23 wherein the measurement circuit includes:
a measurement counter; and
a measurement register coupled to the measurement counter, wherein the frequency signal is coupled to be output from the measurement register.

29. The frequency determination circuit of claim 28 wherein a measurement count of the measurement counter is coupled to be saved in the measurement register and wherein the measurement counter is coupled to be reset in response to each positive crossing pulse that is received from the positive crossing sense circuit.

30. The frequency determination circuit of claim 29, wherein a value saved in the measurement register is coupled to be added to the measurement count of the measurement counter in response to the validation circuit.

* * * * *